United States Patent
Yoon et al.

(10) Patent No.: US 8,426,274 B2
(45) Date of Patent: Apr. 23, 2013

(54) METHOD OF FORMING RECESS AND METHOD OF MANUFACTURING SEMICONDUCTOR DEVICE HAVING THE SAME

(75) Inventors: Jun-Ho Yoon, Suwon-si (KR); Kyoung-Sub Shin, Seongnam-si (KR); Sung-Sam Lee, Yongin-si (KR); Kung-Hyon Nam, Hwaseong-si (KR); Hong Cho, Yongin-si (KR); Joon-Seok Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 289 days.

(21) Appl. No.: 12/861,247

(22) Filed: Aug. 23, 2010

(65) Prior Publication Data

US 2011/0053327 A1    Mar. 3, 2011

(30) Foreign Application Priority Data

Sep. 3, 2009    (KR) .................. 10-2009-0083071

(51) Int. Cl.
*H01L 21/336* (2006.01)
*H01L 21/762* (2006.01)
(52) U.S. Cl.
USPC .............. 438/270; 438/437; 257/E21.546; 257/E21.41
(58) Field of Classification Search ................ None
See application file for complete search history.

(56) References Cited

U.S. PATENT DOCUMENTS

| 7,666,743 | B2 * | 2/2010 | Lee et al. ............... 438/270 |
| 7,778,073 | B2 * | 8/2010 | Willer et al. ........... 365/185.03 |
| 7,910,438 | B2 * | 3/2011 | Cho et al. ............... 438/270 |
| 2007/0232042 | A1 | 10/2007 | Cho |
| 2010/0102385 | A1 * | 4/2010 | Lee et al. ............... 257/331 |
| 2010/0285644 | A1 * | 11/2010 | Lee et al. ............... 438/239 |

FOREIGN PATENT DOCUMENTS

| KR | 10-0695422 | 3/2007 |
| KR | 10-0744041 | 7/2007 |
| KR | 10-2008-0002552 | 1/2008 |

\* cited by examiner

*Primary Examiner* — Seahvosh Nikmanesh
(74) *Attorney, Agent, or Firm* — Harness, Dickey & Pierce

(57) ABSTRACT

Example embodiments relate to a method of forming a recess and a method of manufacturing a semiconductor device having the same. The method includes forming a field region defining an active region in a substrate. The active region extends in a first direction in the substrate. The method further includes forming a preliminary recess extending in a second direction different from the first direction and crossing the active region in the substrate, plasma-oxidizing the substrate to form a sacrificial oxide layer along a surface of the substrate having the preliminary recess, and removing portions of the sacrificial oxide layer and the active region by plasma etching to form a recess having a width larger than a width of the preliminary recess, where an etch rate of the active region is one to two times greater than an etch rate of the sacrificial oxide layer.

16 Claims, 7 Drawing Sheets

METHOD OF FORMING RECESS AND METHOD OF MANUFACTURING SEMICONDUCTOR DEVICE HAVING THE SAME

PRIORITY STATEMENT

This application claims the benefit of priority under 35 U.S.C. §119 from Korean Patent Application No. 10-2009-0083071, filed on Sep. 3, 2009, the contents of which are hereby incorporated herein by reference in its entirety.

BACKGROUND

1. Field

Example embodiments relate to a method of forming a recess and a method of manufacturing a semiconductor device having the same.

2. Description of Related Art

As semiconductor devices become highly integrated, widths of active regions are being reduced. When a recess is formed in the active region having a small width, a periphery of the active region may have a cusp. When a recessed channel array transistor is formed in the active region having the cusp, a gate insulating layer of the transistor may be deteriorated, and an electrical field may be concentrated on the cusp, causing deterioration of the transistor.

SUMMARY

Example embodiments provide a method of forming a recess and a method of manufacturing a semiconductor device having the same.

The method includes forming a field region defining an active region in a substrate. The active region extends in a first direction in the substrate. The method further includes forming a preliminary recess extending in a second direction different from the first direction and crossing the active region in the substrate, plasma-oxidizing the substrate to form a sacrificial oxide layer along a surface of the substrate having the preliminary recess, and removing portions of the sacrificial oxide layer and the active region by plasma etching to form a recess having a width larger than a width of the preliminary recess, where an etch rate of the active region is one to two times greater than an etch rate of the sacrificial oxide layer.

The plasma-oxidizing step may be performed in a same process chamber as the plasma etching step. The plasma-oxidizing step may be performed at a bias power of 0 to 50 W to form the sacrificial oxide layer having a thickness that is larger at a bottom surface of the preliminary recess than at a side surface of the preliminary recess.

The preliminary recess formed in the active region may have a bowl shape, where a thickness of the sacrificial oxide layer at a center part of the preliminary recess is greater than a thickness of the sacrificial oxide layer at a side part of the preliminary recess.

The method may further include plasma-oxidizing the substrate having the recess, and forming a buffer oxide layer along a surface of the substrate having the recess. The plasma-oxidizing the substrate having the recess step may be performed in a same process chamber as the plasma-etching step.

The method may further include cleaning the substrate having the recess using a cleaning liquid including hydrofluoric acid (HF), a cleaning solution including sulfuric acid ($H_2SO_4$), or a cleaning solution including ammonia hydroxide ($NH_3OH$) and hydrogen peroxide ($H_2O_2$). The active region may include silicon and the field region may include silicon and at least one of oxygen and nitrogen.

The field region may be formed by forming a trench in the substrate, forming a first buffer oxide layer, a nitride liner, and a second buffer oxide layer along an inner surface of the trench, and forming an isolation layer to bury the trench in which the first buffer oxide layer, the nitride liner, and the second buffer oxide layer are formed.

The active region may have an oval shape. Alternatively, the active region may have a bar shape. The forming a preliminary recess step forms the preliminary recess to cross the active region and the field region, where a width of the preliminary recess crossing the active region is larger than a width of the preliminary recess crossing the field region. A side surface of the preliminary recess formed at the active region may have a bowl shape and a side surface of the preliminary recess formed at the field region may extend in a plane. The bowl of the active region may be connected to the plane of the field region to generate a cusp at a boundary between the active region and the field region. The plasma etching step removes or smoothes the cusp. Also, the sacrificial oxide layer may have a thickness larger at the cusp than at a center of the bowl.

Example embodiments also provide a method of manufacturing a semiconductor device. The method includes forming a field region defining an active region in a substrate, where the active region extends in a first direction in the substrate. The method further includes forming a preliminary recess extending in a second direction different from the first direction and partially crossing the active region in the substrate, plasma-oxidizing the substrate to form a sacrificial oxide layer along a surface of the substrate having the preliminary recess, and removing portions of the sacrificial oxide layer and the active region by plasma etching to form a recess having a width larger than a width of the preliminary recess, where an etch rate of the active region is one to two times greater than an etch rate of the sacrificial oxide layer. The method further includes forming a gate electrode having the recess, and forming drain and source regions.

The gate electrode may be formed by forming a gate insulating layer along a surface of the recess, forming a conductive layer on the substrate having the gate insulating layer, and partially etching the conductive layer to form the gate electrode, the gate electrode including a first pattern to bury the recess and a second pattern extending from the first pattern.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. These inventive concepts, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concepts are not limited to example embodiments described.

[First Embodiment]

FIGS. 1 through 5 are schematic plan views for explaining a method of forming a recess in accordance with example embodiments of the inventive concepts.

Figure 1:
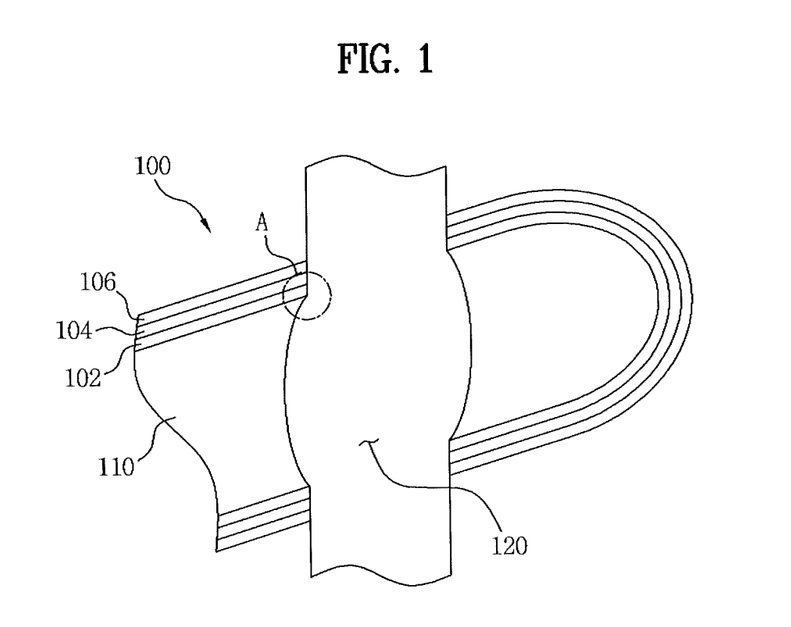
FIGS. 1 through 5 are schematic plan views for explaining a method of forming a recess in accordance with example embodiments of the inventive concepts.

Referring to FIG. 1, a pad oxide layer (not shown) is formed on a substrate 100 or 110.

The substrate 100 or 110 may be a silicon (Si) substrate or a silicon-germanium (Si—Ge) substrate. The pad oxide layer may include silicon oxide, and may be formed by chemical vapor deposition (CVD) or thermal oxidation.

A first mask (not shown) may be formed on the pad oxide layer. The pad oxide layer and the substrate 100 or 110 may be etched to form a pad oxidation pattern (not shown) and a trench (not shown) using the first mask as an etching mask. For example, the trench may be formed by plasma-etching the substrate 100 or 110.

A first buffer oxide layer 102 may be continuously formed along an inner surface profile of the trench. The first buffer oxide layer 102 may mitigate plasma damage to an inner surface of a trench caused when the trench is formed by the plasma etching.

A nitride liner 104 and a second buffer oxide layer 106 may be sequentially formed on the first buffer oxide layer 102 continuously along the inner surface profile of the trench. The nitride liner 104 and the second buffer oxide layer 106 may isolate adjacent trenches.

An isolation layer (not shown) may be formed on the pad oxidation pattern and the substrate 100 or 110 to bury the trench in which the first buffer layer 102, the nitride liner 104 and the second buffer oxide layer 106 are formed. The isolation layer may be formed of an oxide or a nitride. For example, the isolation layer may be formed of boron phosphorous silicate glass (BPSG), spin on glass (SOG), fluorinate silicate glass (FSG), high density plasma (HDP) oxide, flowable oxide (FOX), or tonen oligomer polysilazane (TOSZ) oxide.

The isolation layer may be polished to faun an isolation pattern exposing an upper surface of the pad oxidation pattern. The isolation pattern may function as a field region 100, and an active region 110 may be defined by the isolation pattern. The active region 110 extends in a first direction. In accordance with example embodiments of the inventive concepts, the active region 110 may have an oval shape. When a plurality of active regions 110 are provided, the active regions 110 may be two-dimensionally arranged in directions of major and minor axes of the active region 110. In accordance with other example embodiments of the inventive concepts, the active region 110 may have a bar shape extending in the first direction. When a plurality of active regions 110 are provided, the active regions 110 may be arranged in a direction perpendicular to the first direction of the active region 110.

A second mask (not shown) may be formed on the pad oxidation pattern.

The pad oxidation pattern and the substrate 100 or 110 may be etched to form a preliminary recess 120 using the second mask as an etching mask. More specifically, the pad oxidation pattern and the substrate 100 or 110 may be anisotropically etched to form the preliminary recess 120 using a plasma etching process, for example.

After forming the preliminary recess 120, the second mask and the pad oxidation pattern may be removed from the substrate 100 or 110. For example, the second mask and the pad oxidation pattern may be removed by an ashing process and a strip process. Then, the substrate 100 or 110 may be cleaned using a diluted hydrofluoric acid (HF) cleaning solution, a sulfuric acid ($H_2SO_4$) cleaning solution, and a SC1 cleaning solution. Here, the SC1 cleaning solution may be a solution in which ammonium hydroxide ($NH_4OH$), hydrogen peroxide ($H_2O_2$) and distilled water are mixed at a ratio of about 1:1:10.

The preliminary recess 120 may partially cross the active region 110 and extend in a second direction substantially different from the first direction. In accordance with example embodiments of the inventive concepts, the preliminary recess 120 may have an oval shape. When a plurality of preliminary recesses 120 are provided, the preliminary recesses 120 may be two-dimensionally arranged in directions of major and minor axes of the preliminary recess 120. In accordance with other example embodiments of the inventive concepts, the preliminary recess 120 may have a bar shape extending in the second direction, and when a plurality of preliminary recesses 120 are provided, the preliminary recesses 120 may be arranged in a third direction substantially perpendicular to the second direction.

The preliminary recess 120 may be formed to cross regions formed of different materials. That is, the preliminary recess 120 may be formed to cross the active region 110 including silicon (Si), and the field region 100 including silicon oxide ($SiO_2$) and silicon nitride (SiN). The preliminary recess 120 crossing the regions formed of different materials has an uneven width. That is, a width of the preliminary recess 120 crossing the active region 110 may be larger than a width of the preliminary recess 120 crossing the field region 100. In addition, a side surface of the preliminary recess 120 formed at the active region 110 may have a bowl shape, and a side surface of the preliminary recess 120 formed at the field region 100 may extend in a plane. Here, the bowl of the active region 110 may be continuously connected to the plane of the field region 100 to generate a cusp A at a boundary between the active region 110 and the field region 100.

Figure 2:
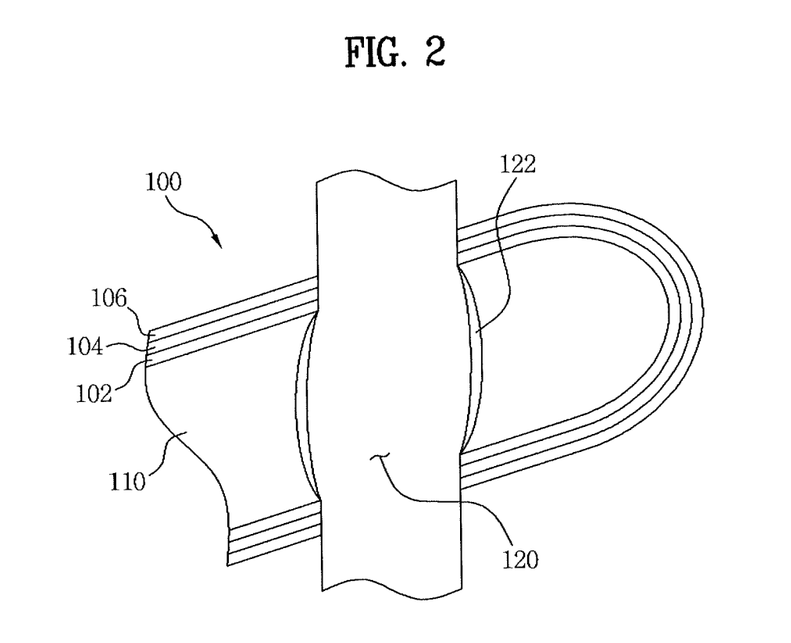

Referring to FIG. 2, the substrate 100 or 110 having the preliminary recess 120 may be primarily oxidized to form a sacrificial oxide layer 122. The sacrificial oxide layer 122 may be continuously formed along a surface of the substrate 100 or 110 having the preliminary recess 120, not burying the preliminary recess 120.

Specifically, the primary oxidation may be performed through a plasma oxidation process. The plasma oxidation process may be performed under conditions of a pressure of about 50 to 110 mT, a temperature of about 20 to 60° C., a source power of about 1000 to 2000 W, and a bias power of about 0 to 50 W, using oxygen gas ($O_2$) of about 110 to 500 sccm and argon gas (Ar) of 400 to 600 sccm through an inductively coupled plasma method.

When the plasma oxidation is performed, oxygen gas ($O_2$) reacts with the surface of the exposed substrate 100 or 110, i.e., silicon (Si), to form a sacrificial oxide layer 122 including silicon oxide ($SiO_2$). The sacrificial oxide layer 122 may be formed on the preliminary recess 120 formed at the active region 110. Here, the sacrificial oxide layer 122 may be thicker at a center part of the bowl-shaped preliminary recess 120 than at a periphery part of the preliminary recess 120.

In addition, the sacrificial oxide layer 122 may mitigate plasma damage to the preliminary recess 120. More specifically, the preliminary recess 120 may be formed by plasma etching, which may cause damage to the surface of the substrate 100 or 110 exposed by the preliminary recess 120. In particular, the substrate 100 or 110 exposed to the bottom surface of the preliminary recess 120 may be more damaged than the substrate 100 or 110 exposed to the side surfaces of the preliminary recess 120. Therefore, in accordance with example embodiments of the inventive concepts, during the plasma oxidation process, a bias power of about 0 to 50 W may be applied to form the sacrificial oxide layer 122 thicker at the bottom surface of the preliminary recess 120 than at the side surfaces of the preliminary recess 120. As a result, it is possible to more effectively recover the bottom surface of the preliminary recess 120, which was more seriously damaged.

Figure 3:
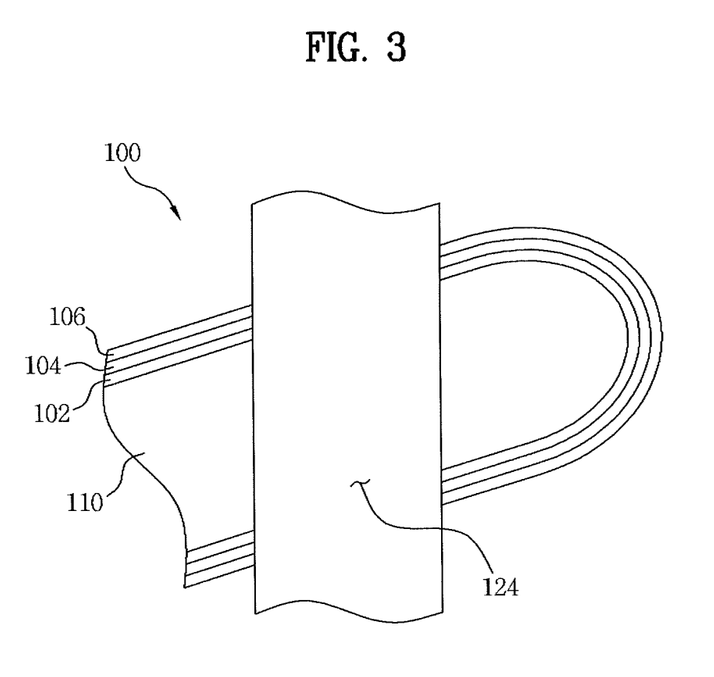

Referring to FIG. 3, portions of the sacrificial oxide layer 122 and the active region 110 may be removed through the plasma etching process to form a recess 124 having a width larger than a width of the preliminary recess 120.

In accordance with example embodiments of the inventive concepts, the plasma etching process may be performed in substantially the same process chamber as the plasma oxidation process.

The plasma etching process may be performed under conditions of a pressure of about 50 to 110 mT, a temperature of about 20 to 60° C., a source power of about 1000 to 2000 W, and a bias power of about 0 to 50 W, using fluoric carbon gas ($C_xF_y$) of about 100 to 200 sccm and oxygen gas ($O_2$) of 20 to 50 sccm through an inductively coupled plasma method. The plasma etching process may be performed for about 20 to 30 seconds.

During the plasma etching process, an etch rate of the active region is one to two times greater than an etch rate of the sacrificial oxide layer. For example, the etch rate of silicon may be substantially the same as or about two times greater than an etch rate of silicon oxide or silicon nitride. That is, the silicon and the silicon oxide or the silicon nitride may have an etch selectivity of about 1:1 to about 2:1.

Portions of the sacrificial oxide layer 122 and the active region 110 may be removed through the plasma etching process. More specifically, the sacrificial oxide layer 122 thicker at the center than at the periphery may be formed so that the periphery of the sacrificial oxide layer 122 may be entirely removed and the center of the sacrificial oxide layer 122 may remain until the active region 110 is exposed through the plasma etching process. The active region 110 exposed to the periphery may be formed of silicon to be etched about one to two times more rapidly than the sacrificial oxide layer 122 remaining on the center. As a result, the cusp A of the periphery may be entirely removed or smoothed during the plasma etching process.

A portion of the field region 100 may be etched during the plasma etching process to make the boundary between the active region 110 and the field region 100 smooth. For example, the recesses formed in the active region 110 and the field region 100 may have substantially the same width as each other.

Figure 4:
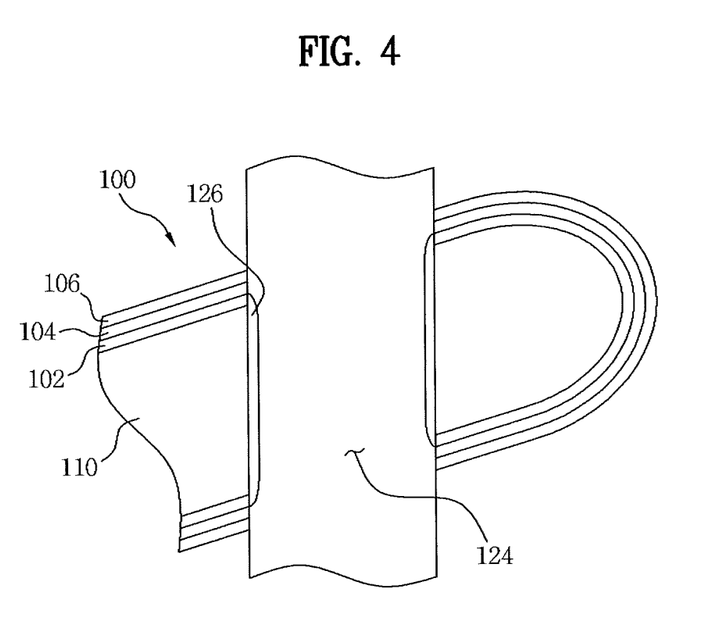

Referring to FIG. 4, the substrate 100 or 110 having the recess 124 may be secondarily oxidized to form a third buffer oxide layer 126. The third buffer oxide layer 126 may be continuously formed along a surface of the substrate 100 or 110 having the recess 124, not burying the recess 124.

In accordance with example embodiments of the inventive concepts, the secondary oxidation process may be performed in the same process chamber substantially the same as the process chamber in which the plasma etching process is performed.

The secondary plasma oxidation may be performed under conditions of a pressure of about 50 to 110 mT, a temperature of about 20 to 60° C., a source power of about 1000 to 2000 W, and a bias power of about 0 to 50 W, using oxygen gas ($O_2$) of about 110 to 500 sccm and argon gas (Ar) of 400 to 600 sccm through an inductively coupled plasma method.

The third buffer oxide layer 126 formed through the plasma oxidation may recover the surface of the substrate 100 or 110, which is damaged when the sacrificial oxide layer 122 is removed through the plasma etching process.

The secondary oxidation process of the substrate 100 or 110 may be selectively performed. That is, the secondary oxidation process may or may not be performed.

Figure 5:
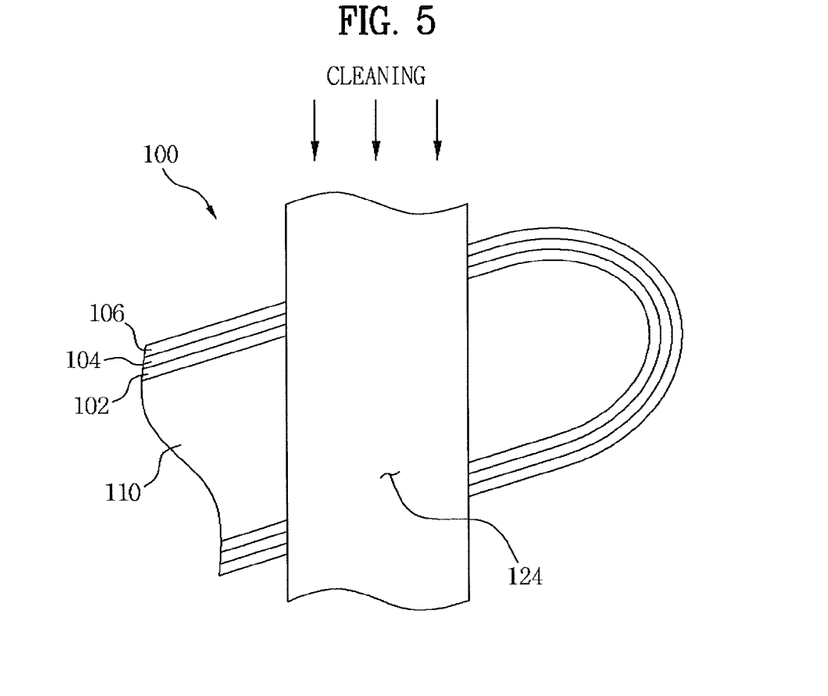

Referring to FIG. 5, the substrate 100 or 110 having the recess 124 may be cleaned.

In accordance with an example embodiment of the inventive concepts, the cleaning process may be a dry cleaning process or a wet cleaning process. For example, the wet cleaning process may use a cleaning solution including diluted fluoric acid (HF) or sulfuric acid (H2SO4), or a SC1 cleaning solution. While the substrate 100 or 110 is cleaned, the sacrificial oxide layer 122 remaining on the substrate 100 or 110 may be removed. In addition, a natural oxide layer formed along the surface of the substrate 100 or 110 may be removed.

[Second Embodiment]

Figure 6:
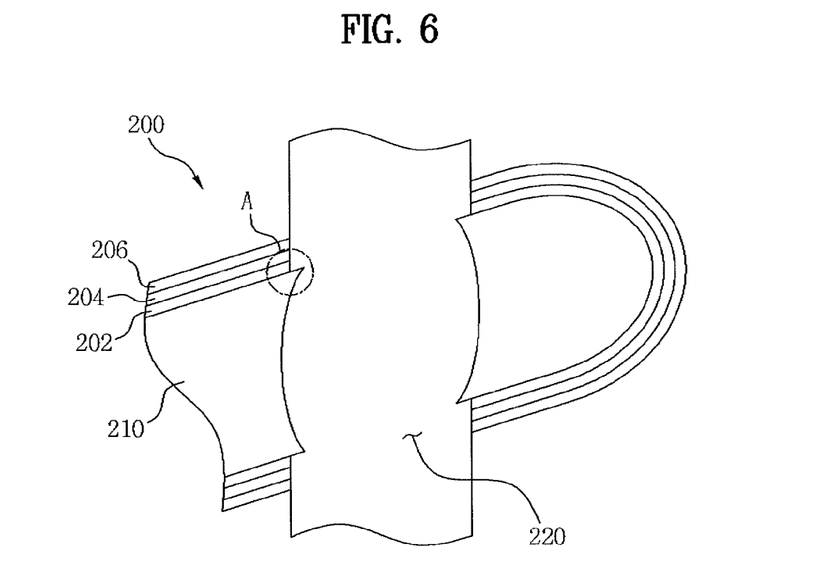
FIGS. 6 through 8 are schematic plan views for explaining a method of forming a recess in accordance with other example embodiments of the inventive concepts.
Figure 7:
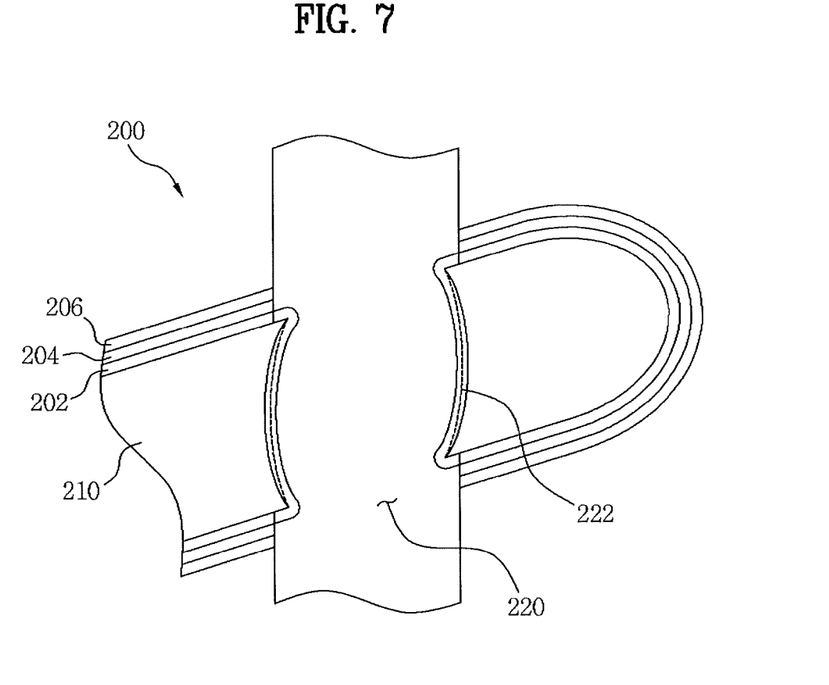
Figure 8:
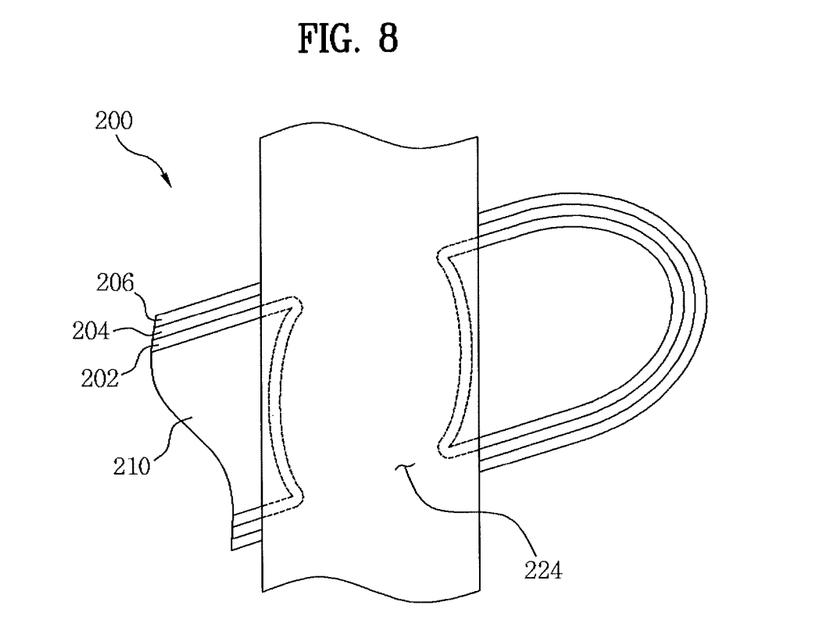

FIGS. 6 through 8 are schematic plan views for explaining a method of forming a recess in accordance with other example embodiments of the inventive concepts.

Referring to FIG. 6, a pad oxide layer (not shown) and a first mask (not shown) may be sequentially formed on a substrate 200 or 210. The substrate 200 or 210 may be a silicon (Si) substrate or a silicon-germanium (Si—Ge) substrate. The pad oxide layer may include silicon oxide, and the first mask may include nitride or photoresist.

The pad oxide layer and the substrate 200 or 210 may be etched to form a pad oxidation pattern (not shown) and a trench (not shown) using the first mask as an etching mask. For example, the trench may be formed by plasma etching the substrate 200 or 210.

A first buffer oxide layer 202, a nitride liner 204 and a second buffer oxide layer 206 may be sequentially and continuously formed along an inner surface profile of the trench.

An isolation layer (not shown) may be formed on the pad oxidation pattern and the substrate 200 or 210 to bury the trench in which the first buffer oxide layer 202, the nitride liner 204 and the second buffer oxide layer 206 are formed. The isolation layer may be formed of an oxide or nitride. For example, the isolation layer may be formed of BPSG, USG, SOG, FSG, HDP oxide, FOX, or TOSZ oxide.

The isolation layer may be polished to form an isolation pattern for exposing an upper surface of the pad oxidation pattern. The isolation pattern may function as a field region 200, and an active region may be defined by the isolation pattern. The active region 210 extends in a first direction. For example, the active region 210 may have an oval shape. When a plurality of active regions 210 are provided, the active regions 210 may be two-dimensionally arranged in directions of major and minor axes of the active region 210.

A second mask (not shown) may be formed on the pad oxidation pattern.

The pad oxidation pattern and the substrate 200 or 210 may be etched to form a preliminary recess 220 using the second mask as an etching mask. More specifically, the pad oxidation pattern and the substrate 200 or 210 may be anisotropically etched using a plasma etching process, etc. to form a preliminary recess 220.

After forming the preliminary recess 220, the second mask and the pad oxide pattern may be removed from the substrate 200 or 210. For example, the second mask and the pad oxidation pattern may be removed by an ashing process and a strip process. Then, the substrate may be cleaned using a diluted hydrofluoric acid (HF) cleaning solution, a sulfuric acid ($H_2SO_4$) cleaning solution, and a SC1 cleaning solution.

The preliminary recess 220 may partially cross the active region 210, and extend in a second direction substantially different from the first direction. For example, the preliminary recess 220 may have an oval shape. When a plurality of preliminary recesses 220 are provided, the preliminary recesses 220 may be two-dimensionally arranged in directions of major and minor axes of the preliminary recess 220. As another example, the preliminary recess 220 may have a bar shape extending in the second direction. When a plurality of preliminary recesses 220 are provided, the preliminary recesses 220 may be arranged in a third direction substantially perpendicular to the second direction.

The preliminary recess 220 may be formed to cross the regions formed of different materials. That is, the preliminary recess 220 may be formed to cross the active region 210 including silicon (Si) and the field region 200 including silicon oxide ($SiO_2$) and silicon nitride (SiN). As such, the preliminary recess 220 formed to cross the regions formed of different materials may have an uneven width. That is, the width of the preliminary recess 220 crossing the active region 210 may be larger than a width of the preliminary recess 220 crossing the field region 200. In addition, side surfaces of the preliminary recess 220 formed in the active region 210 may have a bowl shape, and side surfaces of the preliminary recess 220 formed in the field region 200 may extend in a plane. The bowl of the active region 210 and the plane of the field region 200 may be connected by a vertical surface to generate a cusp A at a boundary between the active region 210 and the field region 200. The cusp A may contact a reaction gas at a wider area upon a plasma oxidation process to be performed.

Referring to FIG. 7, the substrate 200 or 210 having the preliminary recess 220 may be primarily oxidized to form a sacrificial oxide layer 222. The sacrificial oxide layer 222 may be continuously formed along a surface profile of the substrate 200 or 210 having the preliminary recess 220, not burying the preliminary recess 220.

Specifically, the primary oxidation may be a plasma oxidation process. The plasma oxidation process may be performed under conditions of a pressure of about 50 to 110 mT, a temperature of about 20 to 60° C., a source power of about 1000 to 2000 W, and a bias power of about 0 to 50 W, using oxygen gas ($O_2$) of about 110 to 500 sccm and argon gas (Ar) of 400 to 600 seem through an inductively coupled plasma method.

When the plasma oxidation is performed, oxygen gas ($O_2$) reacts with the surface of the exposed substrate 200 or 210, i.e., silicon (Si), to form a sacrificial oxide layer 222 including silicon oxide ($SiO_2$). The sacrificial oxide layer 222 may be substantially formed in the preliminary recess 220 formed in the active region 210. In particular, the cusp A may readily contact the reaction gas by the vertical surface so that the cusp A can be completely oxidized. Therefore, the sacrificial oxide layer 222 may have a larger thickness at the cusp A than at a center of the bowl.

In addition, the sacrificial oxide layer 222 may mitigate plasma damage to the preliminary recess 220. More specifically, the preliminary recess 220 may be formed by plasma etching. Here, plasma may cause damage to the surface of the substrate 200 or 210 exposed by the preliminary recess 220. In particular, a portion of the substrate 200 or 210 exposed to the bottom surface of the preliminary recess 220 may be further damaged by plasma than a portion of the substrate 200 or 210 exposed to side surfaces of the preliminary recess 220. Therefore, in accordance with example embodiments of the inventive concepts, during the plasma oxidation process, a bias power of about 0 to 50 W may be applied to form the sacrificial oxide layer 222 having a thickness larger at the bottom surface of the preliminary recess 220 than at the side surfaces of the preliminary recess 220. As a result, it is possible to more effectively recover the bottom surface of the preliminary recess 220.

Referring to FIG. 8, portions of the sacrificial oxide layer 222 and the active region 210 may be removed by a plasma etching process to form a recess 224 having a larger width than the preliminary recess 220.

In accordance with example embodiments of the inventive concepts, the plasma etching process may be performed in substantially the same chamber as the plasma oxidation process.

The plasma etching process may be performed under conditions of a pressure of about 50 to 110 mT, a temperature of about 20 to 60° C., a source power of about 1000 to 2000 W, and a bias power of about 0 to 50 W, using fluoric carbon gas (CxFy) of about 100 to 200 seem and oxygen gas (O2) of 20 to 50 seem through an inductively coupled plasma method. The plasma etching process may be performed for about 20 to 30 seconds.

During the plasma etching process, an etch rate of the active region is one to two times greater than an etch rate of the sacrificial oxide layer. For example, an etch rate of silicon may be substantially the same as or about two times greater than that of silicon oxide or silicon nitride. That is, the silicon and the silicon oxide or the silicon nitride may have an etch selectivity of about 1:1 to about 2:1.

Portions of the sacrificial oxide layer 222 and the active region 210 may be removed through the plasma etching process. More specifically, the sacrificial oxide layer 222 thicker at the center than at the periphery may be formed so that the periphery of the sacrificial oxide layer 222 can be entirely removed and the center of the sacrificial oxide layer 222 can remain until the active region 210 is exposed through the plasma etching process. The active region 210 exposed to the periphery may be formed of silicon to be etched about one to two times more rapidly than the sacrificial oxide layer 222 remaining on the center. As a result, the cusp A of the periphery can be entirely removed or smoothed during the plasma etching process.

In addition, a portion of the field region may be etched during the plasma etching process so that a boundary between the active region 210 and the field region 200 can be smoothed. For example, the recesses formed at the active region 210 and the field region 200 may have substantially the same width.

While not shown, the substrate 200 or 210 having the recess 224 may be secondarily oxidized to form a third buffer oxide layer 226. The third buffer layer 226 may be continuously formed along a surface profile of the substrate 200 or 210 having the recess 224, not burying the recess 224.

The secondary plasma oxidation may be performed under conditions of a pressure of about 50 to 110 mT, a temperature of about 20 to 60° C., a source power of about 1000 to 2000 W, and a bias power of about 0 to 50 W, using oxygen gas ($O_2$) of about 110 to 500 sccm and argon gas (Ar) of 400 to 600 seem through an inductively coupled plasma method.

The third buffer oxide layer 226 formed through the plasma oxidation may recover the surface of the substrate 200 or 210 damaged when the sacrificial oxide layer 222 is removed through the plasma etching process.

Next, the substrate 200 or 210 having the recess 224 may be cleaned.

In accordance with example embodiments of the inventive concepts, the cleaning may be performed through a dry cleaning process or a wet cleaning process. For example, the wet cleaning process may use a cleaning solution including diluted fluoric acid (HF) or sulfuric acid (H2SO4), or a SC1 cleaning solution. While the substrate 200 or 210 is cleaned, the sacrificial oxide layer 222 remaining on the substrate 200 or 210 may be removed. In addition, a natural oxide layer formed along the surface of the substrate 200 or 210 may be removed.

[Third Embodiment]

Hereinafter, a method of manufacturing a semiconductor device in accordance with example embodiments of the inventive concepts using the method of forming a recess shown in FIGS. 1 to 5 will be described. This method will be explained with reference to FIGS. 9-11.

Figure 9:
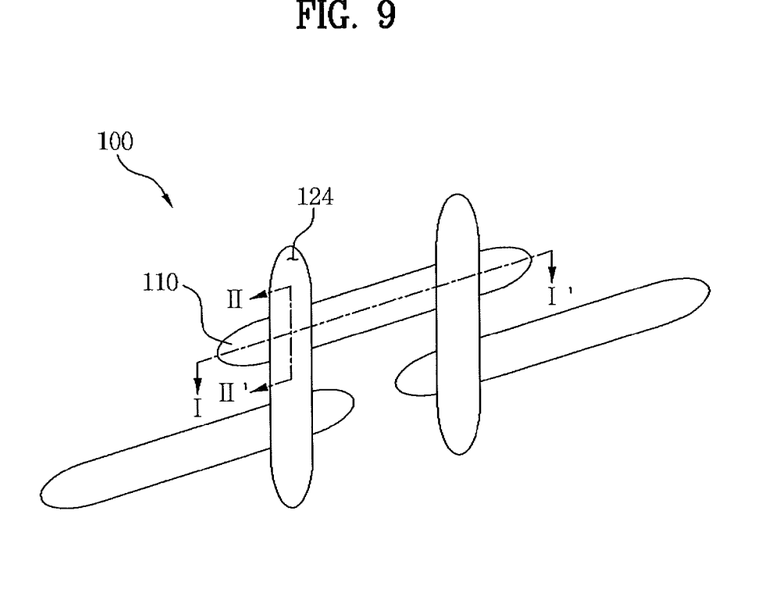
FIG. 9 is a schematic plan view for explaining recesses in accordance with example embodiments of the inventive concepts.
Figure 10:
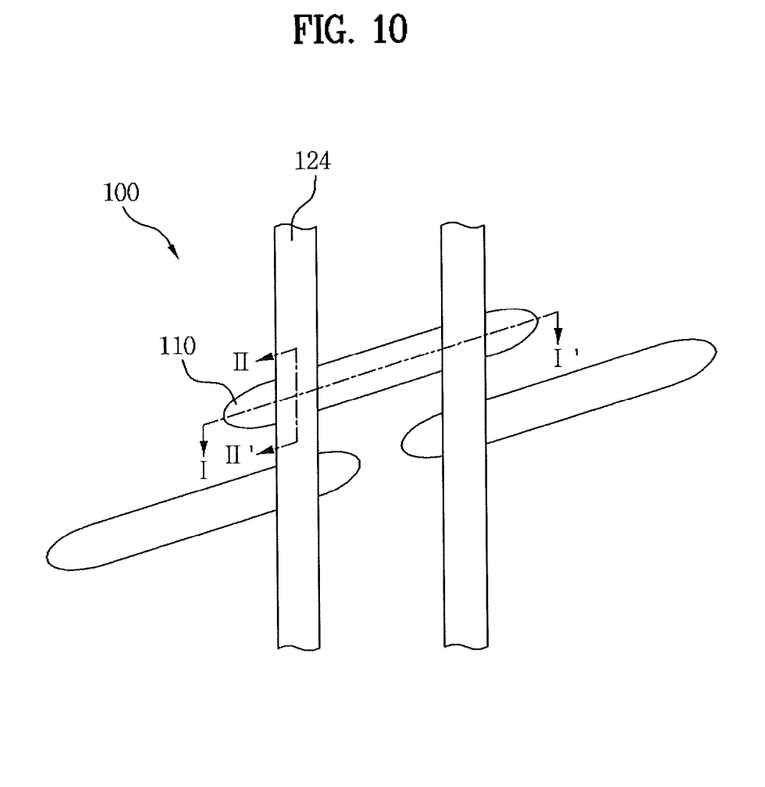
FIG. 10 is a schematic plan view for explaining recesses in accordance with other example embodiments of the inventive concepts.

FIG. 9 is a schematic plan view for explaining recesses in accordance with example embodiments of the inventive concepts. FIG. 10 is a schematic plan view for explaining recesses in accordance with other example embodiments of the inventive concepts.

Referring to FIGS. 9 and 10, a recess 124 may be formed in the substrate 100 or 110 including the active region 110 and the field region 100. A process of forming an isolation pattern for defining the active region 110 in the substrate 100 or 110 and a process of forming the recess 124 are substantially the same as those described with reference to FIGS. 1 to 5, and thus, description thereof will not be repeated.

The active region 110 may extend in a first direction. For example, the active region 110 may have an oval shape. When a plurality of active regions 110 are provided, the active regions 110 may be two-dimensionally arranged in directions of major and minor axes of the active region 110. Here, the direction of the major axis of the active region 110 may be the first direction.

The recess 124 may extend in a second direction substantially different from the first direction. For example, referring to FIG. 9, the recess 124 may have an oval shape. When a plurality of recesses 124 are provided, the recesses 124 may be two-dimensionally arranged in directions of major and minor axes of the recess 124. Here, the direction of the major axis of the recess 124 may be the second direction. As another example, referring to FIG. 10, the recess 124 may have a bar shape extending in the second direction. When a plurality of recesses 124 are provided, the recesses 124 may be arranged in a direction substantially perpendicular to the second direction.

Figure 11:
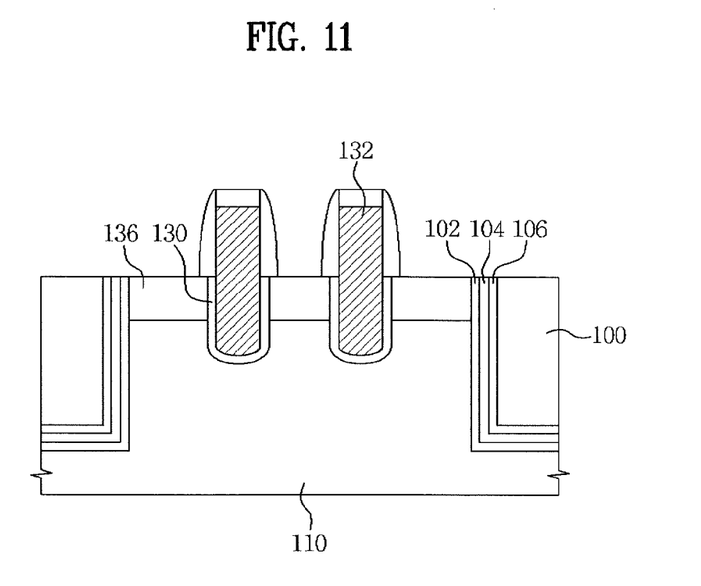
FIG. 11 is a cross-sectional view taken along line I-I' of FIGS. 9 and 10 to explain a semiconductor device in accordance with example embodiments of the inventive concepts.

FIG. 11 is a cross-sectional view taken along line I-I' of FIGS. 9 and 10 to explain a semiconductor device in accordance with example embodiments of the inventive concepts.

Referring to FIG. 11, a gate insulating layer 130 may be formed in the substrate 100 or 110 having the recess 124 along the surface of the recess 124. The gate insulating layer 130 may include an oxide material such as silicon oxide, which may be formed by a thermal oxidation process or a chemical vapor deposition (CVD) process.

For example, the gate insulating layer 130 may be continuously formed along a surface of the substrate 100 or 110 having the recess 124. As another example, the gate insulating layer 130 may be continuously formed along an inner surface of the recess 124.

A conductive layer (not shown) may be formed on the substrate 100 or 110 having the gate insulating layer 130. Here, the conductive layer may completely bury the recess 124. The conductive layer may include impurity-doped polysilicon, metal, or a metal compound, and may be formed by a chemical vapor deposition process, a sputtering process, or an electro-plating process, for example.

The conductive layer may be partially etched to form a gate electrode 132 having an upper surface higher than the upper surface of the substrate 100 or 110. For example, when the recess 124 has an oval shape, the gate electrode 132 may include a lower pattern configured to bury the recess 124, and an upper pattern extending from the lower pattern. Adjacent upper patterns may be electrically connected to each other and extend in the second direction. That is, the gate electrode 132 may function as a word line.

Impurities may be implanted into the substrate 100 or 110 adjacent to the recess 124 to form source/drain regions 136. The source/drain regions 136 may be formed by an ion implantation process and a diffusion process. More specifically, an arbitrary element may be ionized to form a beam and then high energy may be accelerated to implant ions so that the ions can be thermally diffused at a high temperature to form the source/drain regions 136 at both sides of the gate electrode 132.

As a result, a recessed channel array transistor including the gate insulating layer 130, the gate electrode 132 and the source/drain regions 136 may be formed.

[Fourth Embodiment]

Hereinafter, a method of manufacturing a semiconductor device in accordance with other example embodiments of the inventive concept using the method of forming a recess shown in FIGS. 1 to 5 will be described. This method will be explained with reference to FIGS. 9-10 and 12.

Referring to FIGS. 9-10, a recess 124 may be formed in a substrate 100 or 110 including an active region 110 and a field region 100. A process of forming an isolation pattern for defining the active region 110 in the substrate 100 or 110 and a process of forming the recess 124 are substantially the same as the description described with reference to FIGS. 1 to 5, and thus, detailed description thereof will not be repeated.

The active region 110 may extend in a first direction. For example, the active region 110 may have an oval shape. When a plurality of active regions 110 are provided, the active regions 110 may be two-dimensionally arranged in directions of major and minor axes of the active region 110. Here, the direction of the major axis of the active region 110 may be the first direction.

The recess 124 may extend in a second direction substantially different from the first direction. For example, referring to FIG. 9, the recess 124 may have an oval shape. When a plurality of recesses 124 are provided, the recesses 124 may be two-dimensionally arranged in directions of major and minor axes of the recess 124. Here, the direction of the major axis direction of the recess 124 may be the second direction. As another example, referring to FIG. 10, the recess 124 may have a bar shape extending in the second direction. When a plurality of recesses 124 are provided, the recesses 124 may be arranged in a direction substantially perpendicular to the second direction.

In addition, the recess 124 may include an active recess 124 formed in the active region 110, and a field recess 124 formed in the field region 100. The field recess 124 may have a bottom surface lower than that of the active recess 124.

Figure 12:
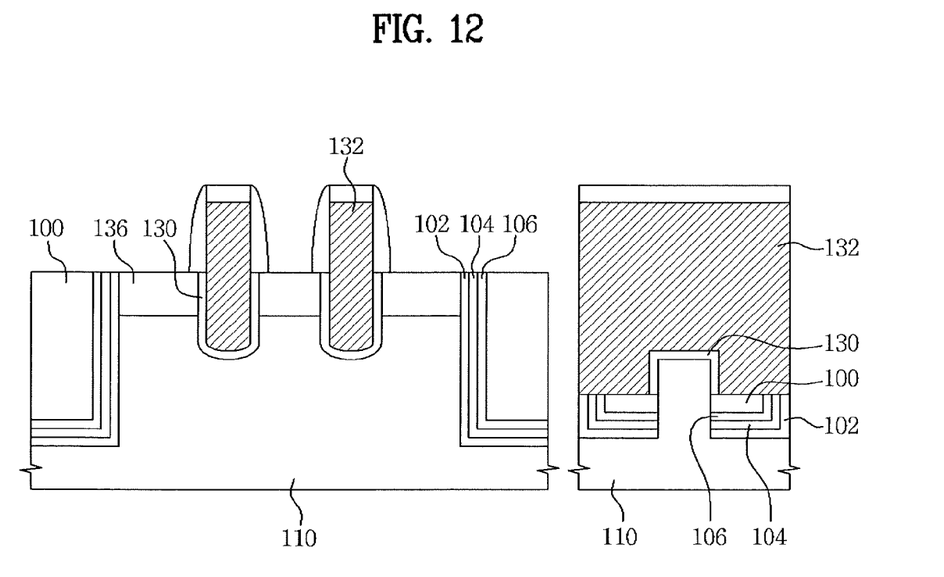
FIG. 12 is cross-sectional views taken along lines I-I' and II-II' of FIGS. 9 and 10 to explain a semiconductor device in accordance with other example embodiments of the inventive concepts.

FIG. 12 is cross-sectional views taken along lines I-I' and II-II' of FIGS. 9 and 10 to explain a semiconductor device in accordance with other example embodiments of the inventive concepts.

Referring to FIG. 12, a gate insulating layer 130 may be formed in the substrate 100 or 110 having the recess 124 along the profile of the recess 124. The gate insulating layer 130 may include an oxide material such as silicon oxide, and may be formed by a thermal oxidation process or a chemical vapor deposition process.

The gate insulating layer 130 may be continuously formed along a surface profile of the substrate 100 or 110 having the recess 124. The first buffer oxide layer 102, the nitride liner 104, and the second buffer oxide layer 106 are the same layers as previously described with reference to FIGS. 1-5.

A conductive layer (not shown) may be formed on the substrate 100 or 110 having the gate insulating layer 130. Here, the conductive layer may completely bury the recess 124. The conductive layer may include impurity-doped polysilicon, metal, or a metal compound, and may be formed by a physical vapor deposition process, a sputtering process, or an electro-plating process.

The conductive layer may be partially etched to form a gate electrode 132 having an upper surface higher than the upper surface of the substrate 100 or 110. For example, when the recess 124 has an oval shape, the gate electrode 132 may include a lower pattern configured to bury the recess 124, and an upper pattern extending from the lower pattern. Adjacent upper patterns may be electrically connected to each other and extend in the second direction. That is, the gate electrode 132 may function as a word line.

Impurities may be implanted into the substrate 100 or 110 adjacent to the recess 124 to form source/drain regions 136.

The source/drain regions 136 may be formed by an ion implantation process and a diffusion process. More specifically, an arbitrary element may be ionized to form a beam and then high energy may be accelerated to implant ions so that the ions can be thermally diffused at a high temperature to form the source/drain regions 136 at both sides of the gate electrode 132.

As a result, a recessed channel array transistor including the gate insulating layer 130, the gate electrode 132 and the source/drain regions 136 may be formed.

[Fifth Embodiment]

Hereinafter, a method of manufacturing a semiconductor device in accordance with still other example embodiments of the inventive concept using the method of forming a recess shown in FIGS. 1 to 5 will be described. This method will be explained with reference to FIGS. 10 and 13.

Referring to FIG. 10, a recess 124 may be formed in a substrate 100 or 110 having an active region 110 and a field region 100. A process of forming an isolation pattern for defining the active region 110 in the substrate 100 or 110 and a process of forming the recess 124 are substantially the same as the description described with reference to FIGS. 1 to 5, and thus, detailed description thereof will not be repeated.

Referring to FIG. 10, the active region 110 may extend in a first direction. For example, the active region 110 may have an oval shape. When a plurality of active regions 110 are provided, the active regions 110 may be two-dimensionally arranged in directions of major and minor axes of the active region 110. Here, the direction of the major axis of the active region 110 may be the first direction.

As shown in FIG. 10, the recess 124 may have a bar shape extending in the second direction. When a plurality of recesses 124 are provided, the recesses 124 may be arranged in a direction substantially perpendicular to the second direction.

Figure 13:
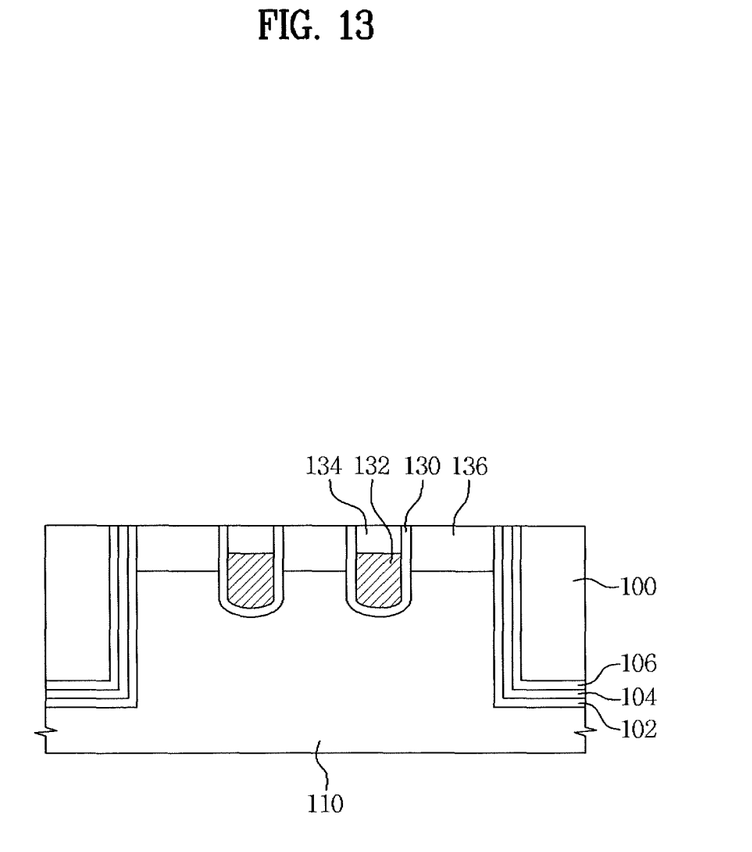
FIG. 13 is a cross-sectional view taken along line I-I' of FIG. 10 to explain a semiconductor device in accordance with still other example embodiments of the inventive concepts.

FIG. 13 is a cross-sectional view taken along line I-I' of FIG. 10 to explain a semiconductor device in accordance with other example embodiments of the inventive concepts. Referring to FIG. 13, a gate insulating layer 130 may be formed in the substrate 100 or 110 having the recess 124 along the profile of the recess 124. The gate insulating layer 130 may include an oxide material such as silicon oxide, and may be formed by a thermal oxidation process or a chemical vapor deposition process.

A conductive layer (not shown) may be formed on the substrate 100 or 110 having the gate insulating layer 130. Here, the conductive layer may completely bury the recess 124. The conductive layer may include impurity-doped polysilicon, metal, or a metal compound, and may be formed by a physical vapor deposition process, a sputtering process, or an electro-plating process.

An upper surface of the conductive layer may be polished to form a gate electrode 132 having an upper surface lower than that of the substrate 100 or 110. That is, the gate electrode 132 may be formed in the recess 124. The polishing may be performed using a chemical mechanical polishing (CMP) process or an etch back process.

A mask 134 may be formed on an opening exposing the gate electrode 132. The mask 134 may include a nitride material, and may function to protect the gate electrode 132.

Impurities may be implanted into the substrate 100 or 110 adjacent to the gate electrode 132 to Bpi n source/drain regions 136. The source/drain regions 136 may be formed by an ion implantation process and a diffusion process. More specifically, an arbitrary element may be ionized to form a beam and then high energy may be accelerated to implant ions so that the ions can be thermally diffused at a high temperature to form the source/drain regions 136 at both sides of the gate electrode 132.

As a result, a recessed channel array transistor including the gate insulating layer 130, the gate electrode 132 and the source/drain regions 136 may be formed.

As can be seen from the foregoing, as a substrate having a cusp is plasma-oxidized to form a sacrificial oxide layer and then the sacrificial oxide layer is removed, a method of forming a recess and a method of manufacturing a semiconductor device including the same that are capable of removing the cusp can be provided. Therefore, it is possible to prevent failures of the device due to the cusp. In addition, by applying a bias power of 0 to 50 W upon the plasma-oxidation, it is possible to more effectively recover plasma damage to a bottom surface of the recess.

The inventive concepts are not limited to the above embodiments but may be varied in various shapes without departing from the spirit of the inventive concepts. For example, the inventive concepts may be applied to a semiconductor device including a volatile memory or a non-volatile memory having a transistor, and a data storage system employing the same.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims.

What is claimed is:

1. A method of forming a recess, comprising:
    forming a field region defining an active region in a substrate, the active region extending in a first direction in the substrate;
    forming a preliminary recess extending in a second direction different from the first direction, the preliminary recess partially crossing the active region in the substrate;
    plasma-oxidizing the substrate to form a sacrificial oxide layer along a surface of the substrate having the preliminary recess; and
    removing portions of the sacrificial oxide layer and the active region by plasma etching to form a recess having a width larger than a width of the preliminary recess, an etch rate of the active region being one to two times greater than an etch rate of the sacrificial oxide layer.

2. The method according to claim 1, wherein the plasma-oxidizing step is performed in a same process chamber as the plasma etching step.

3. The method according to claim 1, wherein the plasma-oxidizing step is performed at a bias power of 0 to 50 W to form the sacrificial oxide layer having a thickness that is larger at a bottom surface of the preliminary recess than at a side surface of the preliminary recess.

4. The method according to claim 1, wherein the preliminary recess formed in the active region has a bowl shape, and
    a thickness of the sacrificial oxide layer at a center part of the preliminary recess is greater than a thickness of the sacrificial oxide layer at a side part of the preliminary recess.

5. The method according to claim 1, further comprising:
    plasma-oxidizing the substrate having the recess, and forming a buffer oxide layer along a surface of the substrate having the recess.

6. The method according to claim 5, wherein plasma-oxidizing the substrate having the recess step is performed in a same process chamber as the plasma-etching step.

7. The method according to claim 1, further comprising:
    cleaning the substrate having the recess using a cleaning liquid including hydrofluoric acid (HF), a cleaning solution including sulfuric acid ($H_2SO_4$), or a cleaning solution including ammonia hydroxide ($NH_3OH$) and hydrogen peroxide ($H_2O_2$).

8. The method according to claim 1, wherein the active region includes silicon and the field region includes silicon and at least one of oxygen and nitrogen.

9. The method according to claim 1, wherein forming the field region comprises:
   forming a trench in the substrate;
   forming a first buffer oxide layer, a nitride liner, and a second buffer oxide layer along an inner surface of the trench; and
   forming an isolation layer to bury the trench in which the first buffer oxide layer, the nitride liner, and the second buffer oxide layer are formed.

10. The method according to claim 1, wherein the active region has an oval shape.

11. The method according to claim 1, wherein the active region has a bar shape.

12. The method according to claim 1, wherein the forming a preliminary recess step forms the preliminary recess to cross the active region and the field region, and a width of the preliminary recess crossing the active region is larger than a width of the preliminary recess crossing the field region.

13. The method according to claim 12, wherein a side surface of the preliminary recess formed at the active region has a bowl shape and a side surface of the preliminary recess formed at the field region extends in a plane.

14. The method according to claim 13, wherein the bowl of the active region is connected to the plane of the field region to generate a cusp at a boundary between the active region and the field region.

15. The method according to claim 14, wherein the plasma etching step one of removes and smoothes the cusp.

16. The method according to claim 14, wherein the sacrificial oxide layer has a thickness larger at the cusp than at a center of the bowl.

\* \* \* \* \*